United States Patent
Coleman et al.

(10) Patent No.: US 11,069,963 B2
(45) Date of Patent: *Jul. 20, 2021

(54) RADIO FREQUENCY (RF) ANTENNA CONTAINING ELEMENT AND METHODS OF MAKING THE SAME

(75) Inventors: James P. Coleman, Maryland Heights, MO (US); Jay Akhave, Claremont, CA (US); Eric Dimalanta, Medina, OH (US)

(73) Assignee: Avery Dennson Corporation, Glendale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/882,289

(22) Filed: Sep. 15, 2010

(65) Prior Publication Data
US 2011/0001670 A1 Jan. 6, 2011

Related U.S. Application Data

(62) Division of application No. 11/338,590, filed on Jan. 24, 2006, now Pat. No. 8,786,510.

(51) Int. Cl.
*H01Q 1/38* (2006.01)
*G06K 19/077* (2006.01)
(Continued)

(52) U.S. Cl.
CPC .......... *H01Q 1/38* (2013.01); *G06K 19/07718* (2013.01); *G06K 19/07728* (2013.01); *G06K 19/07749* (2013.01); *H01Q 1/2225* (2013.01); *H01Q 7/00* (2013.01); *H05K 3/041* (2013.01); *H05K 3/046* (2013.01); *H05K 1/0271* (2013.01); *H05K 3/386* (2013.01); *H05K 2203/0191* (2013.01); *H05K 2203/0522* (2013.01); *H05K 2203/1545* (2013.01); *Y10T 29/49016* (2015.01); *Y10T 156/1082* (2015.01); *Y10T 156/11* (2015.01); *Y10T 156/1994* (2015.01)

(58) Field of Classification Search
None
See application file for complete search history.

(56) References Cited

U.S. PATENT DOCUMENTS 2,961,746 A 11/1960 Lyman
3,240,647 A 3/1966 Morgan
(Continued)

FOREIGN PATENT DOCUMENTS

CN 101297307 10/2008
CN 101300591 11/2008
(Continued)

OTHER PUBLICATIONS

Non-Final Rejection dated Mar. 29, 2013 from USPTO in U.S. Appl. No. 11/338,590.*
(Continued)

*Primary Examiner* — Trinh V Dinh

(57) ABSTRACT

A radio frequency (RF) antenna containing element is provided. The RF antenna containing element includes a reinforced metal foil laminate antenna bonded to a carrier layer. The reinforced metal foil laminate antenna includes a metal foil layer bonded to a reinforcement layer. The reinforcement layer can mitigate tearing of the metal foil layer during formation of the antenna.

14 Claims, 5 Drawing Sheets

(51) Int. Cl.
*H01Q 1/22* (2006.01)
*H01Q 7/00* (2006.01)
*H05K 3/04* (2006.01)
*H05K 1/02* (2006.01)
*H05K 3/38* (2006.01)

(56) References Cited

U.S. PATENT DOCUMENTS

| | | |
|---|---|---|
| 3,938,931 A | 2/1976 | Emmel |
| 4,369,557 A | 1/1983 | Vandebult |
| 4,664,966 A | 3/1987 | Bailey et al. |
| 4,711,996 A | 12/1987 | Drexler |
| 4,717,438 A | 1/1988 | Benge |
| 4,745,268 A | 5/1988 | Parker et al. |
| 4,745,288 A | 5/1988 | Hurley et al. |
| 4,900,386 A | 2/1990 | Richter-Jorgensen |
| 5,142,270 A | 8/1992 | Appalucci |
| 5,161,276 A | 11/1992 | Hutton et al. |
| 5,331,443 A | 7/1994 | Stanisci |
| 5,434,917 A | 7/1995 | Naccache et al. |
| 5,566,441 A | 10/1996 | Marsh et al. |
| 5,632,842 A | 5/1997 | Oliver |
| 5,645,932 A | 7/1997 | Uchibori |
| 5,656,115 A | 8/1997 | Tanno et al. |
| 5,708,419 A | 1/1998 | Isaacson et al. |
| 5,709,484 A | 1/1998 | Dorner |
| 5,725,935 A | 3/1998 | Rajan |
| 5,751,256 A | 5/1998 | McDonough et al. |
| 5,754,256 A | 5/1998 | Kim |
| 5,759,422 A | 6/1998 | Schmelzer et al. |
| 5,800,724 A | 9/1998 | Habeger et al. |
| 5,861,809 A | 1/1999 | Eckstein |
| 6,072,383 A | 6/2000 | Gallagher, III et al. |
| 6,100,804 A * | 8/2000 | Brady ............ G06K 19/07749 257/678 |
| 6,147,662 A | 11/2000 | Grabau et al. |
| 6,161,276 A | 12/2000 | Droz |
| 6,164,551 A | 12/2000 | Altwasser |
| 6,191,382 B1 | 2/2001 | Damikolas |
| 6,313,747 B2 | 6/2001 | Imaichi et al. |
| 6,259,369 B1 | 7/2001 | Monico |
| 6,265,977 B1 * | 7/2001 | Vega ................ G06K 19/0723 257/679 |
| 6,320,556 B1 | 11/2001 | Cyman et al. |
| 6,333,721 B1 | 12/2001 | Altwasser |
| 6,352,497 B1 | 3/2002 | Hensley et al. |
| 6,353,420 B1 * | 3/2002 | Chung ........................ 343/895 |
| 6,400,323 B2 | 6/2002 | Tasukawa et al. |
| 6,424,315 B1 | 7/2002 | Glenn et al. |
| 6,451,154 B1 | 9/2002 | Grabau et al. |
| 6,466,131 B1 | 10/2002 | Tuttle et al. |
| 6,476,775 B1 * | 11/2002 | Oberle ........................ 343/895 |
| 6,509,837 B1 | 1/2003 | Tuttle et al. |
| 6,609,844 B1 | 8/2003 | Petteruti et al. |
| 6,698,116 B2 | 3/2004 | Waldron |
| 6,781,508 B2 | 8/2004 | Tuttle et al. |
| 6,836,215 B1 * | 12/2004 | Laurash et al. ............ 340/572.1 |
| 6,839,029 B2 | 1/2005 | Mendolia et al. |
| 6,933,892 B2 * | 8/2005 | Oberle .................. 343/700 MS |
| 6,940,408 B2 | 9/2005 | Ferguson et al. |
| 6,988,666 B2 | 1/2006 | Appalucci et al. |
| 7,014,729 B2 | 3/2006 | Grabau et al. |
| 7,047,624 B2 | 5/2006 | Vogt |
| 7,116,227 B2 | 10/2006 | Eckstein et al. |
| 7,122,235 B2 | 10/2006 | Bourdelais et al. |
| 7,176,053 B1 | 2/2007 | Dimmler |
| 7,224,280 B2 | 5/2007 | Ferguson |
| 7,245,227 B2 | 7/2007 | Winter |
| 7,250,868 B2 | 7/2007 | Kurz et al. |
| 7,256,738 B2 | 8/2007 | Mizukawa et al. |
| 7,283,035 B2 | 10/2007 | Tuttle et al. |
| 7,284,704 B2 | 10/2007 | Lubow |
| 7,300,863 B2 | 11/2007 | Pennaz et al. |
| 7,309,007 B2 | 12/2007 | Kean |
| 7,345,575 B2 | 3/2008 | Tuttle et al. |
| 7,374,095 B2 | 5/2008 | Blank et al. |
| 7,463,150 B2 | 12/2008 | Rajan |
| 7,477,194 B2 | 1/2009 | Coleman et al. |
| 7,497,004 B2 | 3/2009 | Cote et al. |
| 7,520,001 B2 | 4/2009 | Gotoh et al. |
| 7,533,455 B2 | 5/2009 | Wehr |
| 7,546,671 B2 | 6/2009 | Finn |
| 7,559,131 B2 | 7/2009 | Credelle et al. |
| 7,621,451 B2 | 11/2009 | Berson |
| 7,633,035 B2 | 12/2009 | Kirmeier |
| 7,641,112 B2 | 1/2010 | Jensen et al. |
| 7,650,683 B2 | 1/2010 | Forster et al. |
| 7,681,301 B2 | 3/2010 | Rodgers |
| 7,836,588 B2 | 11/2010 | Laksin et al. |
| 7,855,645 B2 | 12/2010 | Rajan |
| 7,893,385 B2 | 2/2011 | Rodgers |
| 7,930,815 B2 | 4/2011 | Coleman et al. |
| 7,997,495 B2 | 8/2011 | Rodgers |
| 8,033,477 B2 | 10/2011 | Jones et al. |
| 8,132,734 B2 | 3/2012 | Lazarowicz et al. |
| 8,146,830 B2 | 4/2012 | Johnson et al. |
| 8,178,028 B2 | 5/2012 | Gandhi |
| 8,191,230 B2 | 6/2012 | Coleman et al. |
| 8,202,567 B2 | 6/2012 | Kohnle et al. |
| 8,786,510 B2 | 7/2014 | Coleman et al. |
| 8,981,936 B2 | 3/2015 | Forster et al. |
| 9,039,866 B2 | 5/2015 | Forster et al. |
| 9,231,290 B2 | 1/2016 | Forster et al. |
| 2002/0018680 A1 | 2/2002 | Young |
| 2002/0025416 A1 | 2/2002 | Uchibori |
| 2003/0051806 A1 | 3/2003 | Appalucci |
| 2003/0112202 A1 | 6/2003 | Vogt |
| 2003/0136503 A1 | 7/2003 | Benoit et al. |
| 2004/0075616 A1 * | 4/2004 | Endo et al. .................. 343/895 |
| 2004/0078957 A1 * | 4/2004 | Forster ............ G06K 19/07718 29/601 |
| 2004/0177492 A1 | 9/2004 | Eckstein et al. |
| 2004/0221952 A1 | 11/2004 | Damikolas |
| 2004/0224135 A1 | 11/2004 | Krebs |
| 2005/0001785 A1 * | 1/2005 | Ferguson et al. ............ 343/895 |
| 2005/0034995 A1 | 2/2005 | Gundlach et al. |
| 2005/0035927 A1 | 2/2005 | Kimura |
| 2005/0083627 A1 | 4/2005 | Wang |
| 2005/0089664 A1 | 4/2005 | Utz |
| 2005/0183617 A1 | 8/2005 | Eckstein et al. |
| 2005/0197074 A1 | 9/2005 | Cullen et al. |
| 2005/0198811 A1 | 9/2005 | Kurz et al. |
| 2005/0205202 A1 | 9/2005 | Chaoui et al. |
| 2005/0206524 A1 | 9/2005 | Forster et al. |
| 2005/0230486 A1 | 10/2005 | Halope |
| 2005/0230791 A1 | 10/2005 | Kanda et al. |
| 2005/0231371 A1 | 10/2005 | Rowe, Jr. |
| 2005/0274611 A1 | 12/2005 | Zercher |
| 2005/0274811 A1 | 12/2005 | Zercher |
| 2005/0284917 A1 | 12/2005 | Clare et al. |
| 2005/0284941 A1 | 12/2005 | Lubow |
| 2006/0244662 A1 | 11/2006 | Bauer et al. |
| 2007/0020932 A1 | 1/2007 | Maruyama et al. |
| 2007/0040686 A1 | 2/2007 | Reis |
| 2007/0078957 A1 | 4/2007 | Ypyä |
| 2007/0094862 A1 | 5/2007 | Posamentier |
| 2007/0102190 A1 | 5/2007 | Sakamoto |
| 2007/0130754 A1 | 6/2007 | Fein |
| 2007/0171129 A1 * | 7/2007 | Coleman et al. ...... 343/700 MS |
| 2007/0188327 A1 | 8/2007 | Keeton et al. |
| 2007/0246843 A1 | 10/2007 | Yang et al. |
| 2008/0047129 A1 | 2/2008 | Say et al. |
| 2008/0047130 A1 | 2/2008 | Lin et al. |
| 2008/0083706 A1 | 4/2008 | Kirmeier |
| 2008/0103238 A1 | 5/2008 | Braidwood et al. |
| 2008/0120834 A1 | 5/2008 | Laksin et al. |
| 2008/0128397 A1 | 6/2008 | Gandhi |
| 2008/0128493 A1 | 6/2008 | Jones et al. |
| 2008/0217309 A1 | 9/2008 | Rodgers |
| 2008/0277069 A1 | 11/2008 | Tharp |
| 2009/0033582 A1 | 2/2009 | Blenkhorn et al. |
| 2009/0230196 A1 | 9/2009 | Johnson et al. |
| 2010/0071831 A1 | 3/2010 | Peters et al. |
| 2010/0089535 A1 | 4/2010 | Hosono et al. |

(56) References Cited

U.S. PATENT DOCUMENTS

| | | | |
|---|---|---|---|
| 2010/0103238 A1 | 4/2010 | Neuhard et al. | |
| 2010/0320275 A1 | 12/2010 | Fu | |
| 2011/0220276 A1 | 9/2011 | Coleman et al. | |
| 2012/0060359 A1 | 3/2012 | Forster et al. | |
| 2012/0061473 A1* | 3/2012 | Forster | G06K 19/07718 235/492 |
| 2012/0064307 A1 | 3/2012 | Forster et al. | |
| 2012/0280047 A1 | 11/2012 | Forster et al. | |
| 2014/0034739 A1 | 2/2014 | Forster et al. | |
| 2014/0047703 A1 | 2/2014 | Forster et al. | |

FOREIGN PATENT DOCUMENTS

| | | |
|---|---|---|
| CN | 101341501 | 1/2009 |
| CN | 101375463 | 2/2009 |
| CN | 101541555 | 9/2009 |
| DE | 3732825 | 3/1988 |
| DE | 4000372 | 7/1991 |
| DE | 4422338 | 6/1994 |
| DE | 19921130 | 5/1999 |
| DE | 20005940 | 8/2000 |
| DE | 69617753 | 8/2002 |
| EP | 0665705 | 8/1995 |
| EP | 790123 | 2/1997 |
| EP | 1120796 | 8/2001 |
| GB | 869076 | 5/1961 |
| JP | 6334704 | 12/1994 |
| JP | H07100793 | 4/1995 |
| JP | 2001127410 | 5/2001 |
| JP | 20011127410 | 5/2001 |
| TW | 200811717 | 3/2008 |
| WO | 9951386 | 10/1999 |
| WO | 2001/054226 | 7/2001 |
| WO | 2001054058 | 7/2001 |
| WO | 03/024708 | 3/2003 |
| WO | WO-2003054708 | 7/2003 |
| WO | 03/107266 | 12/2003 |
| WO | 2005/083627 | 9/2005 |
| WO | 2005/089143 | 9/2005 |
| WO | 2007053355 | 5/2007 |
| WO | 2007/087189 | 8/2007 |
| WO | 2008148527 | 12/2008 |
| WO | 2009/101249 | 8/2009 |
| WO | 2009118455 | 10/2009 |

OTHER PUBLICATIONS

Amended claims filed Jun. 12, 2012 in U.S. Appl. No. 11/338,590.*
Definition of RFID, Techonology.com, printed out on Mar. 18, 2014, 1 page.*
International Search Report and Written Opinion issued in PCT/US2007/01048 dated Sep. 28, 2007.
International Search Report and Written Opinion issued in PCT/US2007/01048 dated Mar. 20, 2008.
International Application Serial No. PCT/US2005/004837, International Search Report dated Jun. 5, 2005, 4 pgs.
"Finecut Narrow Web Laser Cutting System," Spartanics®, www.spartanics.com, 2 pages, no date shown.
"Finecut Laser Cutting Systems," Spartanics®, www.spartanics.com, 4 pages, no date shown.
"Fineprint Flatbed Screen Printing Line, Roll-to-Roll," Spartanics®, www.spartanics.com, 2 pages, no date shown.
"Cold Foil for Dummies®," J. Michael Rivera, Wiley Publishing, Inc., copyright 2004.
International Search Report and Written Opinion dated Oct. 6, 2011 for International Application No. PCT/US2011/040379.
International Search Report and Written Opinion dated Oct. 6, 2011 for International Application No. PCT/US2011/040383.
International Search Report and Written Opinion dated Oct. 6, 2011 for International Application No. PCT/US2011/041743.
International Search Report and Written Opinion dated Oct. 6, 2011 for International Application No. PCT/US2011/040391.
Partial European Search Report dated May 16, 2014 for International Application No. EP13 00 5668.
Supplementary European Search Report dated Feb. 9, 2010 for European Application EP 07 76 2542.
Definition of RFID, Technology.com, printed Mar. 18, 2014, 1 page.
International Preliminary Report on Patentability dated May 2, 2011 for International Application PCT/US2007/001048 filed Jan. 16, 2007.
European Search Report dated Feb. 16, 2016 for International Application No. EP13 00 5668.
International Search Report and Written Opinion dated Jan. 12, 2012 for International Application No. PCT/US2011/040386 filed Jun. 14, 2011.
International Preliminary Report on Patentability dated Dec. 14, 2012 for International Application No. PCT/US2011/040386 filed Jun. 14, 2011.
International Preliminary Report on Patentability dated Dec. 14, 2012 issued in corresponding IA No. PCT/US2011/040379 filed Jun. 14, 2011.
International Preliminary Report on Patentability dated Dec. 14, 2012 issued in corresponding IA No. PCT/US2011/040383 filed Jun. 14, 2011.
International Preliminary Report on Patentability dated Dec. 28, 2012 issued in corresponding IA No. PCT/US2011/041743 filed Jun. 24, 2011.
International Preliminary Report on Patentability dated Dec. 14, 2012 issued in corresponding IA No. PCT/US/2011/040391 filed Jun. 14, 2011.

* cited by examiner

RADIO FREQUENCY (RF) ANTENNA CONTAINING ELEMENT AND METHODS OF MAKING THE SAME

CROSS-REFERENCE TO RELATED APPLICATION

The present application is a division of U.S. application Ser. No. 11/338,590 filed on Jan. 24, 2006, which is incorporated herein by reference in its entirety.

TECHNICAL FIELD

The present invention relates generally to communications, and more particularly to a radio frequency (RF) antenna containing element and methods of making the same.

BACKGROUND

There is an increasing demand for providing products with radio frequency (RF) circuits, such as radio frequency identification (RFID) tags and labels. RFID tags and labels can have a combination of antennas and analog and/or digital electronics, which may include, for example, communication electronics, data memory, and control logic. RFID tags and labels are widely used to associate an object with an identification code. For example, RFID tags are used in conjunction with security-locks in cars, for access control to buildings, and for tracking inventory and parcels. RFID tags and labels can include active tags, which include a power source, as well as passive tags and labels, which do not.

An important element of RF circuits is the RF antenna. An RF antenna can have a configuration where two substantial bodies of conductive material are properly spaced from each other so as to define two antenna portions, which are bridged by a circuit chip comprising an RF transponder. The antennas can be produced by utilizing conductive ink, or may be in the form of etched conductive foil. While products made from such structure function properly, the conductive ink does not provide a high grade antenna since it cannot be as thick or as conductive, in general, as can a conductive foil. However, the conventional etching techniques for applying foil do not lend themselves to high speed production.

SUMMARY

In one aspect of the invention, a radio frequency (RF) antenna containing element is provided. The RF antenna containing element can comprise a metal foil laminate antenna that includes a metal foil layer bonded to a reinforcement layer, and a carrier layer bonded to the metal foil laminate antenna.

In another aspect of the invention, a method of forming an RF antenna containing element is provided. The method comprises providing a metal foil laminate bonded to a carrier layer. The metal foil laminate can have a metal foil layer bonded to a reinforcement layer. The method further comprises cutting an antenna pattern through the metal foil laminate to the carrier layer, and removing an undesired matrix portion of the reinforced metal foil laminate to provide a metal foil laminate antenna disposed on the carrier layer.

In yet another aspect of the invention, another method of forming an RF antenna containing element is provided. The method comprises providing a metal foil laminate having a metal foil layer bonded to a reinforcement layer, patterning an antenna adhesive pattern to the reinforcement layer, and laminating a carrier layer with the reinforcement layer. The method further comprises cutting an antenna pattern in registration with the antenna adhesive pattern through the metal foil laminate to the carrier layer, and removing an undesired matrix portion of the reinforced metal foil laminate to provide a metal foil laminate antenna disposed on the carrier layer.

DETAILED DESCRIPTION

The present invention relates to RF antenna containing elements and methods of making the same. The RF antenna containing element includes a reinforced metal foil laminate antenna bonded to a carrier layer. The reinforced metal foil laminate antenna includes a metal foil layer bonded to a reinforcement layer. The reinforcement layer mitigates tearing of the metal foil layer during formation of the antenna.

Although the present examples are illustrated with respect to fabrication of an RFID inlay, the present invention is applicable to a variety of RF antenna containing elements including other intermediate assemblies for a RF antenna or final assemblies (e.g., an RFID tag).

Figure 1:
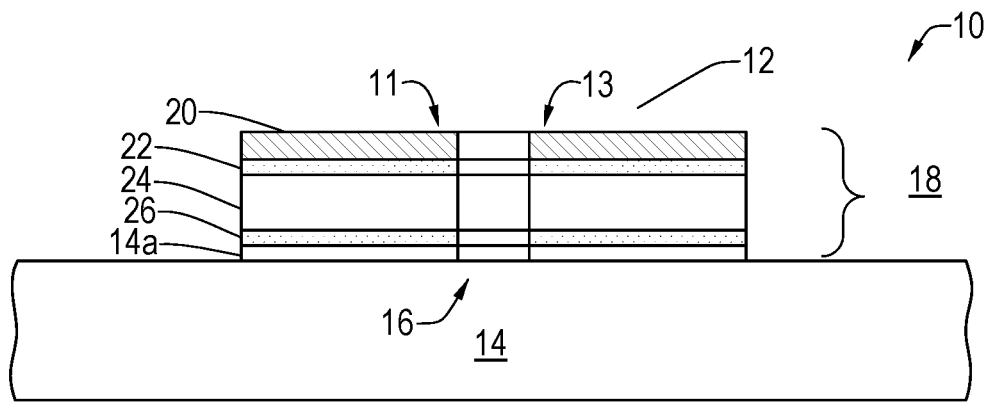
FIG. 1 illustrates a cross-sectional view of an RFID inlay in accordance with an aspect of the present invention.

FIG. 1 illustrates a cross-sectional view of an RFID inlay 10 in accordance with an aspect of the present invention. The RFID inlay 10 includes an antenna structure 12 supported by a carrier sheet (or layer) 14. The antenna structure 12 may be releasably attached via a release layer 14a or permanently bonded to the carrier sheet 14. The antenna structure 12 can be in the form of a variety of different shapes, sizes and types. For example, the antenna structure 12 can be a dipole antenna with opposing antenna connection ends. The antenna structure 12 includes a gap 16 for placement and bonding of an RFID chip (not shown) to connection ends 11 and 13 of the antenna structure 12. The carrier sheet or layer 14 can be in the form of a polymeric film having a thickness in the range of about 0.02 mm (1.0 mils) to about 0.08 mm (3.0 mils) (e.g., about 0.05 mm (2 mils)). Examples of materials that can be used to form the carrier sheet 14 include, but are not limited to, polyester films, polyethylene terephthalate (PET) films and polyimide films.

Examples of other of materials that can be used the carrier sheet or layer 14 include, but are not limited to, polycarbonate, polyarylate, polysulfone, a norbornene copolymer, polyphenylsulfone, polyetherimide, polyethylenenaphthalate (PEN), polyethersulfone (PES), polycarbonate (PC), a phenolic resin, polyetherester, polyetheramide, cellulose acetate, aliphatic polyurethanes, polyacrylonitrile, polylrifluoroethylenes, polyvinylidene fluorides, high density polyethylenes (HDPEs, poly (methyl methacrylates), a cyclic or acyclic polyolefins. Alternatively, the carrier sheet or layer 14 can be formed of a paper material, such as a card stock paper, a bond paper or other paper type. The carrier sheet 14 can be formed of materials that are flexible, such that the carrier sheet 14 can be manufactured as a continuous web, which can be wound into roll form for use in a roll-to-roll process.

The antenna structure 12 is formed from a reinforced metal foil laminate 18. The reinforced metal foil laminate 18 includes a metal foil layer 20 bonded to a reinforcement layer 24. The metal foil layer 20 can be formed from an aluminum foil, a copper foil, a steel foil or other metal foil. The metal foil layer 20 can have a thickness in the range of about 1.5 microns to about 20 microns (e.g., about 10 microns). Furthermore, the metal foil layer can have a tensile strength of about 100 to about 140 megapascals (MPa) (e.g., about 120 Mpa) and an elongation at break of about 20% to about 30% (e.g., 25%). The metal foil layer 20 can be bonded to the reinforcement layer 24 by an adhesive, such as a temperature and/or pressure activated adhesive. A wide variety of adhesives may be employed to bond the metal foil layer 20 to the reinforcement layer 24. For example, a general-purpose, permanent pressure sensitive adhesive and/or laminating adhesive may be employed. By way of example, the adhesive can be an acrylic based and/or elastomeric based temperature and/or pressure activated adhesive. In one aspect of the invention, the adhesive is an ethylene-acrylic acid (EM) copolymer adhesive, which exhibits excellent bonding characteristics between metal foils and polymeric materials. The adhesive can be flood or roll coated to form an adhesive layer 22 having a thickness in the range of about 1 micron to about 3 microns (e.g., about 2 microns) with a coatweight of about 2 grams per square meter (gsm).

The reinforcement layer 24 can be in the form of a polymeric film having a thickness in the range of about 0.002 mm (0.1 mils) to about 0.05 mm (2.0 mils) (e.g., about 0.025 mm (1 mil)). Examples of materials that can be used for forming a reinforcement layer include, but are not limited to, polyester films, polyethylene terephthalate (PET) films and polyimide films. Other polymeric materials can be employed such as those suggested above with respect to the carrier layer 14. Alternatively, the reinforcement layer 24 can be formed of a paper material. The reinforcement layer 24 can be formed of materials that are flexible, such that the reinforcement layer 24 in combination with the adhesive layer 22 and metal layer 20 can be manufactured as a continuous web, which can be wound into roll form for use in a roll-to-roll process.

In one aspect of the invention, the antenna structure 12 is formed on the carrier sheet 14 by performing a partial die cut with a die (not shown) having a shape generally matching a shape of the desired antenna structure. The die cuts through the reinforced metal foil laminate 18 and an adhesive layer 26 to the underlying carrier layer 14. In this aspect of the invention, the carrier layer 14 can have a release coating, such that the undesired portions or waste material (hereinafter referred to as the "matrix material" or "matrix portion") of the reinforced metal foil laminate 18 and underlying adhesive material 26 are readily removed, such that only the reinforced metal foil laminate portion of the desired antenna structure 12 remains on the carrier layer 14. The adhesive layer 26 can be a rubber based pressure activated adhesive. The adhesive can be flood or roll coated to form the adhesive layer 26 having a thickness in the range of about 5 micron to about 25 microns (e.g., about 15 microns) with a coatweight of about 25 gsm.

In another aspect of the invention, the antenna structure 12 is formed on the carrier layer 14 by applying a patterned adhesive 26 having a shape generally matching a shape of the desired antenna structure 12 on a back side of the reinforcement layer 24 of the reinforced metal foil laminate 18. The carrier layer 14 can be laminated with the reinforcement layer 24, and the patterned adhesive 26 can then be cured. In one aspect of the invention, the patterned adhesive 26 is an ultra-violet (UV) curable adhesive. A partial die cut with a die having a shape generally matching a shape of the desired antenna structure 14 is performed. The die cuts through the reinforced metal foil laminate 18 to the underlying carrier layer 14 in registry with the patterned adhesive 26 to form the antenna structure 12. The undesired portions or "matrix material" of the reinforced metal foil laminate 18 and undesired adhesive material are readily removed, such that only the reinforced metal foil laminate portion of the desired antenna structure 12 remains on the carrier layer 14. The remaining adhesive layer 26 of the antenna structure 12 can have a thickness in the range of about 5 micron to about 25 microns (e.g., 15 microns) with a coatweight of about 25 gsm.

Figure 2:
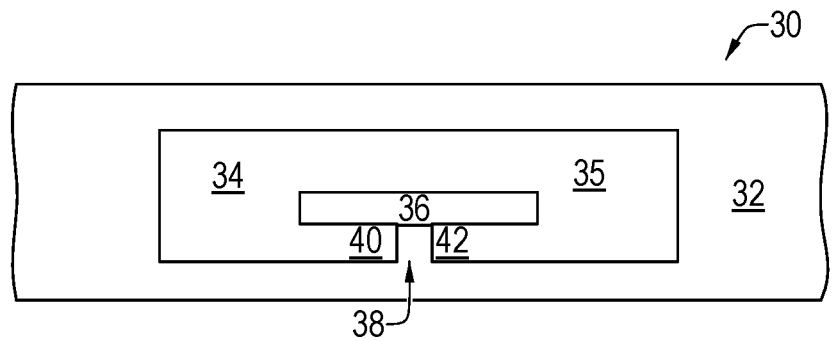
FIG. 2 illustrates a top view of an RFID inlay in accordance with an aspect of the present invention.

FIG. 2 illustrates a top view of an RFID inlay 30 in accordance with an aspect of the present invention. The RFID inlay 30 includes a carrier layer 32 and an antenna structure 34 formed of a reinforced metal foil laminate 35. The antenna structure 34 includes a generally T-shaped opening 36 that defines antenna contact ends 40 and 42, which are spaced apart via a gap 38. It is to be appreciated that the present invention is applicable to a variety of antenna types, shapes and sizes. The gap 38 is sized to allow placement of an RFID chip (not shown) that can be bonded to the carrier layer 32 with bonding pads or contacts of the RFID chip coupled to respective antenna contact ends 40 and 42 via contact extensions (not shown). The antenna structure 34 can be formed employing a partial die cut in the shape of the antenna structure 34 on a reinforced metal foil laminate 35 bonded to the carrier layer 32 with the remaining matrix material of the reinforced metal foil laminate being removed. The materials and dimensions of the reinforced metal foil laminate, adhesives and carrier layer 32 can be selected to be formed of materials that are durable and flexible, such that the carrier sheet 32, adhesives and reinforced metal foil laminate 35 can be manufactured as a continuous web which can be wound into roll form for use in a roll-to-roll process.

It is to be appreciated that the die employed in the partial die cut may have certain feature size limitations, such that the gap 38 formed between the antenna connection ends 40 and 42 is too large to directly connect the RFID chip. Therefore, contact extensions can be provided to couple the contact pads of the chip to the antenna connection ends 40 and 42. A number of methodologies can be employed to form contact extensions, such as the use of straps, interposers and carriers as is known in the art.

Figure 3:
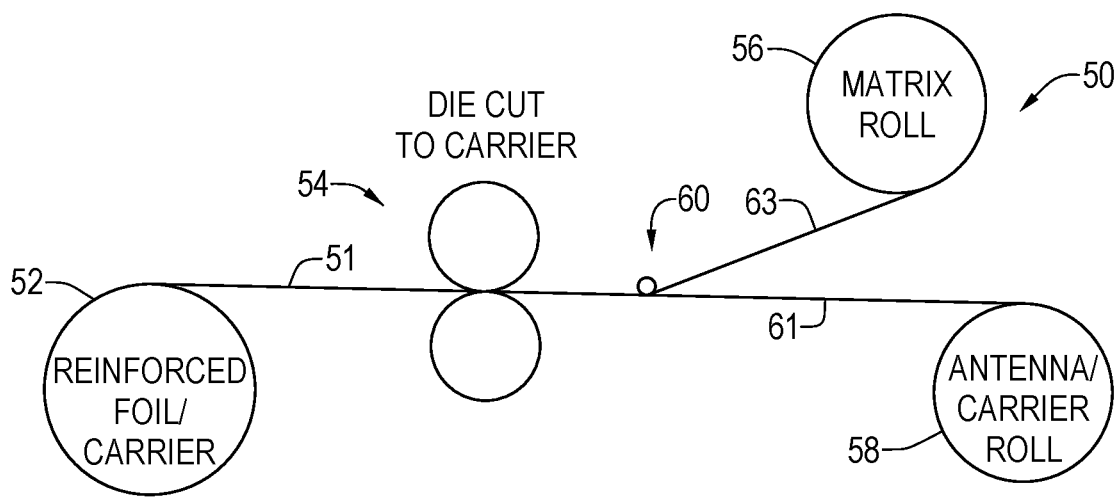
FIG. 3 illustrates a roll-to-roll process in accordance with an aspect of the present invention.

FIG. 3 illustrates a roll-to-roll process 50 for forming an antenna structure in accordance with an aspect of the present invention. In the roll-to-roll process, a web 51 comprising a reinforced metal foil laminate bonded to a carrier layer via an adhesive layer is unwound via an unwinder 52 and fed to a die cutter 54. The reinforced metal foil laminate includes a metal foil layer bonded to a reinforcement layer via an adhesive layer as discussed above with respect to FIGS. 1-2. The reinforcement layer provides the metal foil layer with additional support to mitigate tearing or ripping of the metal foil during the removal of the undesired matrix portion of the web 51. The die cutter 54 repeatedly performs a partial die cut with a die having a shape generally matching a shape of the desired antenna structure as the web 51 passes through the die cutter 54. The die cutter 54 can be a mechanical die cutter, such as a rotary die anvil. It is to be appreciated that although the antenna pattern described herein is formed via a die cutter, other methodologies of performing a die cut through the reinforced metal foil laminate to the carrier layer may be employed, such as laser die cutting, microperforation, and other cutting techniques.

The die of the die cutter 54 cuts through the reinforced metal foil laminate and an adhesive layer to the underlying carrier layer to provide a cut that defined the desired antenna structure and the undesired matrix portion of the reinforced metal foil laminate. The web 51 is then passed through a stripper 60 that strips and separates the undesired matrix portion of the reinforced metal foil laminate from the desired reinforced metal foil laminate antenna structures and the supporting carrier layer. The reinforced metal foil laminate antenna structure and carrier layer form a web 61 that is wound into an antenna/carrier roll via a first rewinder 58. The matrix portion of the reinforced metal foil laminate form another web 63 that is wound into a matrix roll via a second rewinder 56. It has been determined that the above process can produce antenna structures at a rate of about 250 feet per minute.

Figure 4:
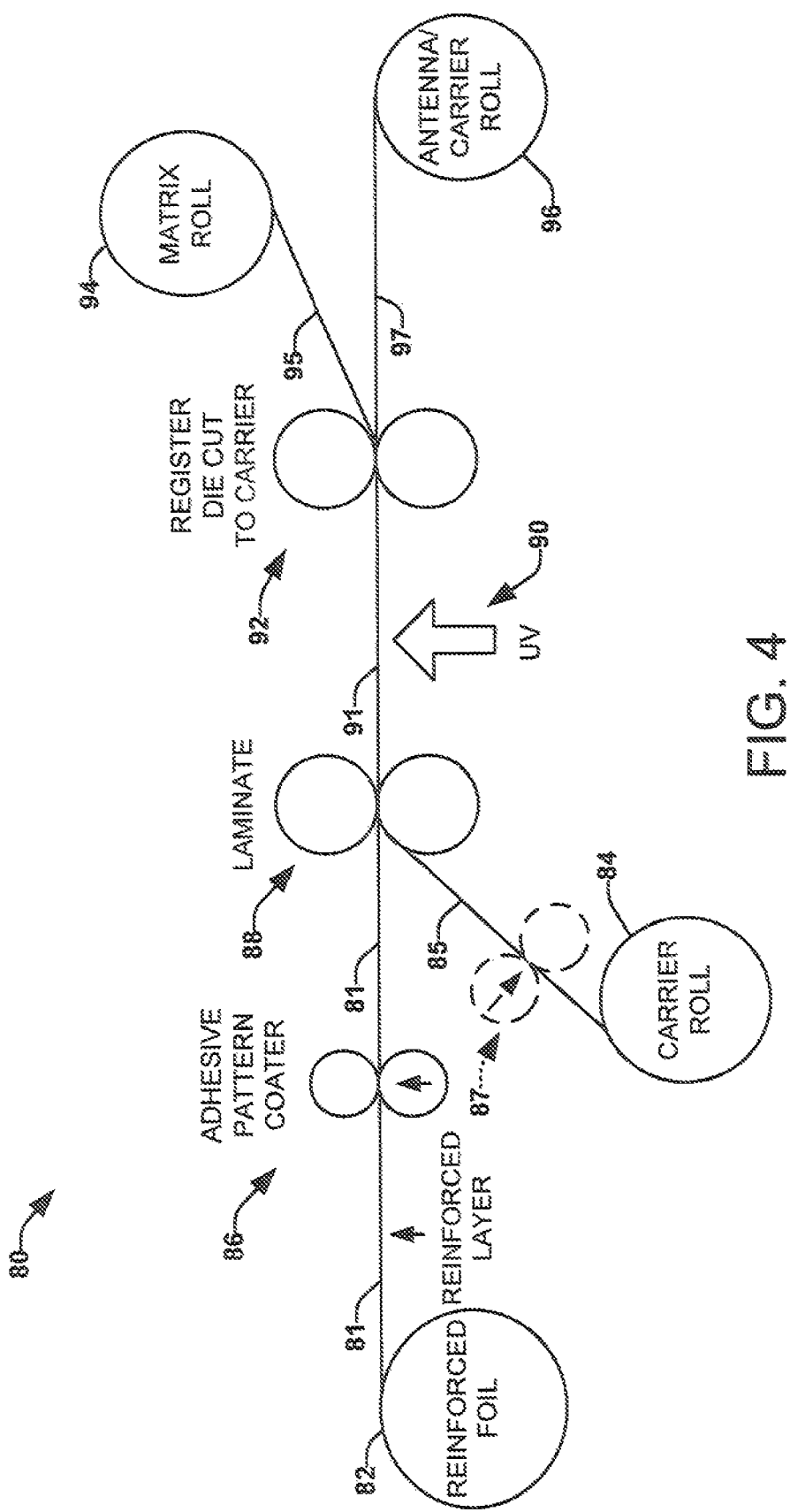
FIG. 4 illustrates another roll-to-roll process in accordance with an aspect of the present invention.

FIG. 4 illustrates a roll-to-roll process 80 for forming an antenna structure in accordance with another aspect of the present invention. A reinforced metal foil laminate in the form of web 81 is unwound via an unwinder 82 and fed to an adhesive pattern coater 86. The adhesive pattern coater 86 can be any conventional pattern coating equipment employed for that purpose. The reinforced metal foil laminate includes a metal foil layer bonded to a reinforcement layer via an adhesive layer as discussed above with respect to FIGS. 1-2. The adhesive pattern coater 86 repeatedly applies an adhesive pattern substantially in the shape of the desired antenna pattern to a back of the reinforcement layer of the web 81 as it passes through the adhesive pattern coater 86. The adhesive employed on the adhesive pattern is, for example, a UV curable adhesive.

The web 81 is then fed through a set of laminating rollers 88 along with a carrier web 85. The carrier web 85 is unwound via an unwinder 84 and fed to the set of laminating rollers 88, such that the web 81 and the carrier web 85 are sandwiched together and laminated. Alternatively, as illustrated with dashed lines, the carrier web 85 can be fed to an adhesive pattern coater 87 to repeatedly apply an adhesive pattern substantially in the shape of the desired antenna pattern to a front of the carrier web 85 as it passes through the adhesive pattern coater 87. A resultant web 91 includes the reinforced metal foil laminate and carrier web with adhesive antenna patterns formed therebetween.

The resultant web 91 passes through a UV station 90 that provides UV light through the carrier layer of the resultant web 91 to cure the adhesive antenna patterns. The carrier layer is selected to be a UV-transparent layer that can be formed from a UV-transparent material, such as a UV-transparent polymeric material. The resultant web 91 is then fed to a die cutter 92. The die cutter 92 repeatedly performs a partial die cut with a die having a shape generally matching a shape of the desired antenna structure, as the resultant web 91 passes through the die cutter 92. The partial die cut is in registration with the antenna adhesive patterns, such that the partial die cut is substantially aligned with the adhesive antenna pattern. The die cutter 92 can be a variety of different mechanical die cutters, such as a rotary die anvil. The die cuts through the reinforced metal foil laminate and the adhesive of the adhesive antenna pattern of the resultant web 91 to the underlying carrier layer to provide a cut generally at or within the outside perimeter of the adhesive antenna pattern. The resultant web 91 is separated, such that the reinforced metal foil laminate antenna structure and carrier layer form a web 97. The web 97 is then wound into an antenna/carrier roll via a first rewinder 96. The undesired matrix portion of the reinforced metal foil laminate and excess adhesive form another web 95 that is wound into a matrix roll via a second rewinder 94. It is been determined that the above process can produce antenna structures at a rate of at least about 50 feet per minute.

As previously stated, the die employed in the partial die cut may have certain feature size limitations, such that the gap formed between the antenna connection ends is too large to directly connect the RFID chip. Straps and/or interposers can be attached to the chip prior to placement on an RFID inlay, but at significant costs to the inlay and the final RFID tag. In accordance with an aspect of the present invention, extensions may be employed to provide electrical coupling between the RFID chip and the antenna. These extensions can be fabricated at a low cost in a manner that allows for direct chip placement.

Additionally, if the metal foil layer employed to form the antenna structure is aluminum foil or copper foil, an oxide layer that readily forms on the aluminum foil or copper foil can create additional resistances in bonding the RFID chip to the antenna. Therefore, portions of the oxide layer on the antenna for which contact is to be made can readily be removed. Removal of portions of the oxide layer can be accomplished by a variety of techniques. For example, removal can be accomplished by scratching, applying pressure, and/or puncturing contact areas or contact ends on the antenna. Alternatively y, conductive bumps can provided at the contact areas or contact ends. The conductive bumps can include a multitude of small, hard particles (e.g., diamond particles) with a multitude of sharp paints for penetrating the oxide layer at the contact area. Additionally, copper contacts can be electroplated to the contact area of the antenna to penetrate the oxide layer.

FIGS. 5-8 illustrate the formation of extensions on an antenna structure to allow for direct RFID chip placement.

In the illustrated examples, the oxide layer over the antenna contact area has been removed or can be removed during formation of the extensions by any of the techniques discussed above.

Figure 5:
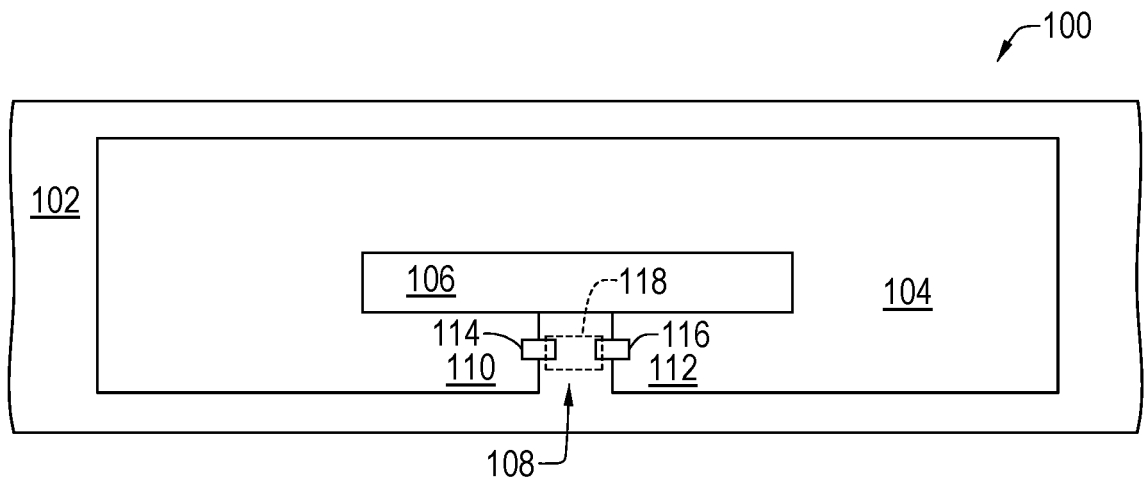
FIG. 5 illustrates a top view of an RFID inlay with antenna connection extensions in accordance with an aspect of the present invention.

FIG. 5 illustrates a top view of an RFID inlay 100 with antenna connection extensions in accordance with an aspect of the present invention. The RFID inlay 100 includes a carrier layer 102 and an antenna structure 104 formed of a reinforced metal foil laminate 105. The antenna structure 34 includes a generally T-shaped opening 106 that defines antenna contact ends 110 and 112 spaced apart via a gap 108. The gap 108 is sized to allow placement of an RFID chip 118 (shown with dashed lines) with bonding pads or contacts coupled to respective antenna contact ends 110 and 112 via contact extensions 114 and 116, respectively.

In one aspect of the invention, the contact extensions 114 and 116 can be formed by transferring foil (e.g., copper foil) in the requisite pattern onto the surface of the contact ends 110 and 112 of the antenna and/or the carrier layer to either enhance the foil of the antenna for bonding or to build an adjoining feature for chip bonding. The transferred foil can be welded to the metal foil using, for example, electrical or magnetic induction welding or impact/explosive welding or ultrasonic welding. The weld head can be selected to provide the desired shape of the contact extensions 114 and 116. Alternatively, the transferred foil can be bonded to the contact ends 110 and 112 via an adhesive, or temporarily bonded via an adhesive prior to welding. The transferred foil can be in the form of a web that can be transferred (e.g., heat transferred) from a substrate via a release layer in a roll-to-roll process.

In another aspect of the invention, the contact extensions 114 and 116 can be formed by printing conductive inks and/or adhesives of the appropriate thicknesses in the extension feature areas, for example, from the carrier layer to the contact ends 110 and 112. Alternatively, chip bond pads can be formed on the carrier layer employing conductive inks and/or adhesives with a transferred foil contact extension providing electrical conductivity between the chip bond pads and the antenna contact ends 110 and 112.

In yet another aspect of the invention, the contact extensions 114 and 116 can be formed by electroplating or electro-deposition of copper onto the contact ends 110 and 112 of the antenna structure, such that the copper extends over the gap providing chip bond pads for direct chip placement. Alternatively, chip bond pads can be formed on the carrier layer employing conductive inks and/or adhesives with an electroplated copper contact extension providing electrical conductivity between the chip bond pads and the antenna contact ends 110 and 112.

Figure 6:
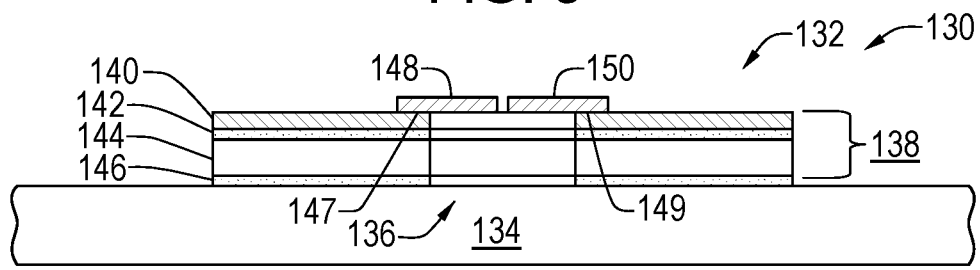
FIG. 6 illustrates a cross-sectional view of an RFID inlay with foil strips bonded to contact ends of an antenna structure in accordance with an aspect of the present invention.

FIG. 6 illustrates a cross-sectional view of an RFID inlay 130 in accordance with an aspect of the present invention. The RFID inlay 130 includes an antenna structure 132 supported by a carrier sheet (or layer) 134. The antenna structure 132 includes a gap 136 for placement and bonding of an RFID chip to contact ends 147 and 149 of the antenna structure 132. The antenna structure 132 is formed from a reinforced metal foil laminate 138. The reinforced metal foil laminate 138 includes a metal foil layer 140 bonded to a reinforcement layer 144 via an adhesive layer 142. The metal foil layer 140 can be formed, for example, from an aluminum foil, a copper foil, steel foil or other metal foil. The reinforced metal foil laminate 138 is bonded to the carrier layer 134 via an adhesive layer 146.

A first foil strip 148 is bonded to a first contact end 147 of the antenna structure 132 with a portion of the first foil strip extending over the gap 136, and a second foil strip 150 is bonded to a second contact end 149 with a portion of the second foil strip extending over the gap 136. The first and second foil strips 148 and 150 can be formed of, for example, copper. The first and second foil strips 148 and 150 can have a thickness in the range of about 1 micron to about 3 microns (e.g., 2 microns). The first and second foil strips 148 and 150 can reside on a web and can be transferred from a substrate via a release layer and/or a heat transfer in a roll-to-roll process.

The first and second foil strips 148 and 150 can be bonded to the first and second contact ends 147 and 149, respectively via an adhesive. The oxide layer over the first and second contact ends 147 and 149 can be removed by scratching, applying pressure and/or puncturing contact areas on the first and second contact ends 147 and 149 on the antenna structure 132. Alternatively, the first and second foil strips 148 and 150 can be bonded to the first and second contact ends 147 and 149 by welding (e.g., a spot weld), thus concurrently bonding the foil strips 148 and 150 and penetrating the oxide layer over the first and second contact ends 147 and 149. Furthermore, contact pads can be formed over the first and second contact ends 147 and 149 by employing conductive bumps with a multitude of hard particles, or electroplating copper to form contact pads prior to placement and bonding of the foil strips 148 and 150.

Figure 7:
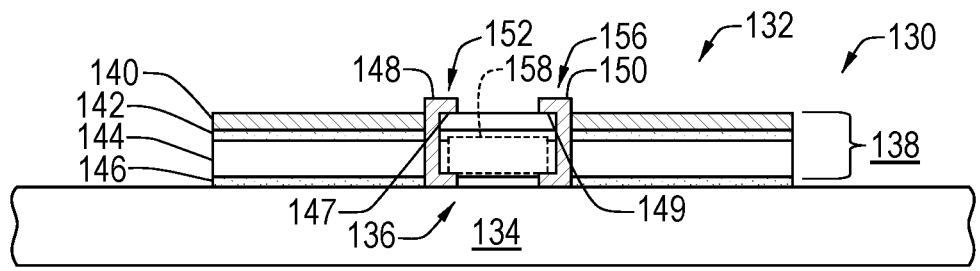
FIG. 7 illustrates a cross-sectional view of the RFID inlay of FIG. 6 after undergoing a weld process in accordance with an aspect of the present invention.

FIG. 7 illustrates a cross-sectional view of the RFID inlay 130 of FIG. 6 after undergoing a weld process in accordance with an aspect of the present invention. The weld process includes employing a weld head having a shape that forms contact extensions 152 and 156 into a desired pattern that allows for direct chip placement. The weld head can concurrently shape the first and second foil strips 148 and 150 into contact extensions and weld the contact extensions 152 and 156 to the first and second contact ends 147 and 149 of the antenna 132 (i.e., metal-to-metal weld) and to the carrier layer 134 (i.e., metal-to-plastic weld). As illustrated in FIG. 7, the contact extensions 152 and 156 have generally right angle bends at contact ends 147 and 149 of a top surface of the antenna 132 and generally right angle bends at a top surface of the carrier layer 134. A first end of each respective contact extension 152 and 156 (foil strip) is electrically coupled to a respective contact area of the antenna 132 with a second end of each respective contact extension 152 and 156 (foil strip) provide bonding pads for direct placement of an RFID chip 158 illustrated with dashed lines.

It is to be appreciated that the contact extensions 152 and 156 can be bonded with adhesive and the weld head being replaced with a print head or shaping tool for forming the shape of the contact extensions 152 and 156. Additionally, the first and second foil strips 148 and 150 can be replaced with a single foil strip that is cut and removed during or after the shaping process.

Figure 8:
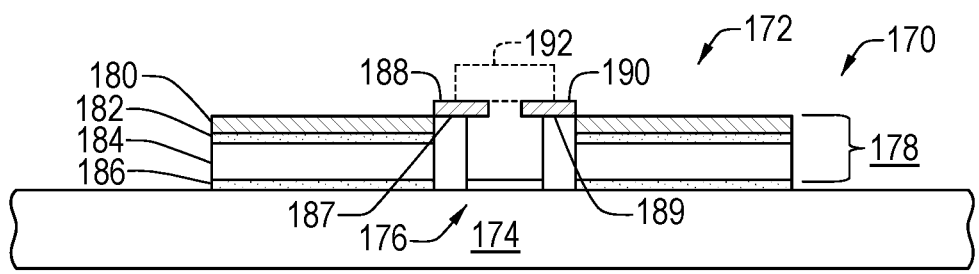
FIG. 8 illustrates a cross-sectional view of an RFID inlay with contact extensions in accordance with an aspect of the present invention.

FIG. 8 illustrates a cross-sectional view of an RFID inlay 170 in accordance with an aspect of the present invention. The RFID inlay 170 includes an antenna structure 172 supported by a carrier sheet (or layer) 174. The antenna structure 172 includes a gap 176 for placement and bonding of an RFID chip to connection ends of the antenna structure 172. The antenna structure 172 is formed from a reinforced metal foil laminate 178. The reinforced metal foil laminate 178 includes a metal foil layer 180 bonded to a reinforcement layer 184 via an adhesive layer 182. The metal foil layer 180 can be formed, for example, from an aluminum foil, a copper foil, a steel foil or other metal foil. The reinforced metal foil laminate 178 is bonded to the carrier layer 174 via an adhesive layer 186.

A first contact extension 188 and a second contact extension 190 extend from antenna contact ends 187 and 189 of the antenna 172 into the gap 176. The contact extensions 188 and 190 can be formed by building up conductive ink and/or conductive adhesive layers from the carrier layer 174 to the contact ends 187 and 189 of the antenna 172. Alternatively, conductive ink and/or conductive adhesive can be built up on the carrier layer 174 with contact pads on the contact ends 187 and 189 of the antenna 172 being formed by employing additional layers of conductive ink and/or adhesive extending from the contact ends 187 and 189 of the antenna 172 into the gap 176. Furthermore, copper extensions can be electroplated from the contact ends 187 and 189 of the antenna 172 to the conductive ink and/or adhesive residing in the gap 176. An RFID chip 192 illustrated with dashed lines can be directly placed on a surface of the first and second contact extensions 188 and 190. Furthermore, the contact extensions 188 and 190 can be formed by providing bond pads that extend from the contact extensions 188 and 190 via conductive ink or conductive adhesive on the carrier layer 174 in the gap 176, such that the RFID chip 192 can be directly placed on the bond pads on the carrier layer 174 in the gap 176.

Figure 9:
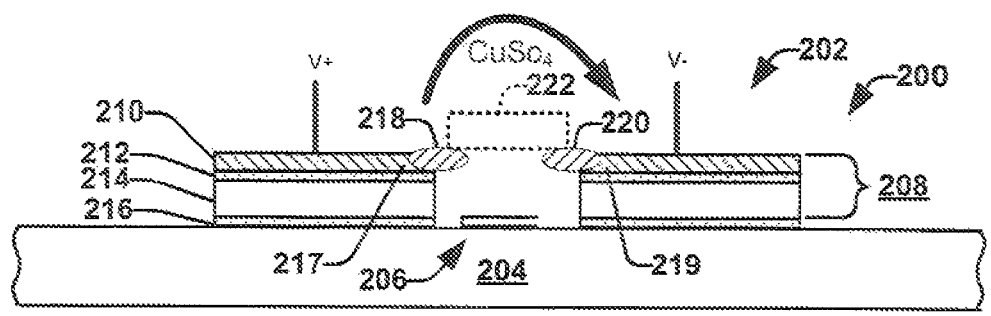
FIG. 9 illustrates a cross-sectional view of an RFID inlay with electrodeposited contact extensions in accordance with an aspect of the present invention.

FIG. 9 illustrates a cross-sectional view of an RFID inlay 200 in accordance with an aspect of the present invention. The RFID inlay 200 includes an antenna structure 202 supported by a carrier sheet (or layer) 204. The antenna structure 202 includes a gap 206 for placement and bonding of an RFID chip to antenna connection ends 217 and 219 of the antenna structure 202. The antenna structure 202 is formed from a reinforced metal foil laminate 208. The reinforced metal foil laminate 208 includes a metal foil layer 210 bonded to a reinforcement layer 214 via an adhesive layer 212. The metal foil layer 210 can be formed from an aluminum foil, a copper foil, steel foil or other metal foil. The reinforced metal foil laminate 208 is bonded to the carrier layer 204 via an adhesive layer 216.

A first contact extension 218 and a second contact extension 220 extend from respective contact ends 217 and 219, respectively, of the antenna 202 into the gap 206 via an electroplating or electro-deposition process. As illustrated in FIG. 9, a voltage potential (V+) is applied to antenna contact ends across the gap 206 immersed in an electrolytic medium. The voltage potential causes electro-deposition of contacts on the tips of the contact ends 217 and 219 of the antenna 202 into the gap 206. In the example of FIG. 9, the electrolytic medium is copper sulfate (CuSo,) resulting in the electro-deposition of copper on the metal foil layer 210 to form the first contact extension 218. The polarity of the voltage potential at the antenna contact ends 217 and 219 to form the second contact extension 220. The first and second contact extensions 218 and 220 form bonding pads for direct placement of an RFID chip 222 illustrated in dashed lines.

Figure 10:
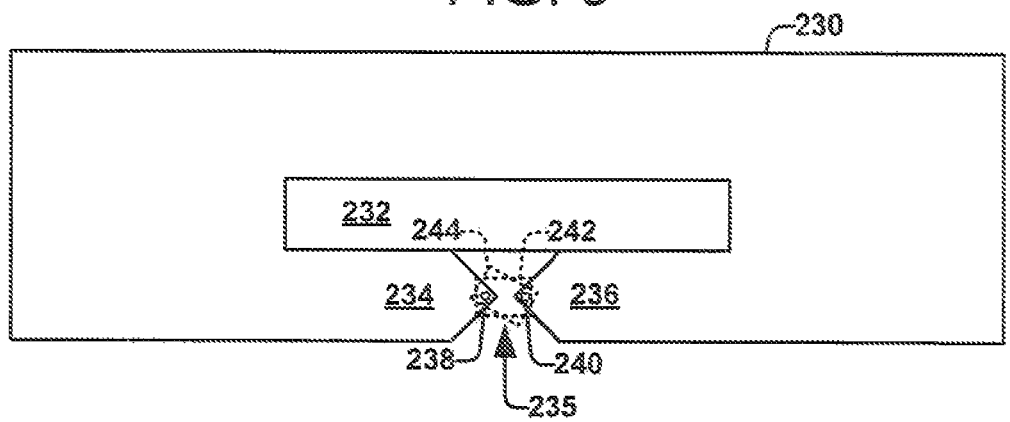
FIG. 10 illustrates a top view of cross-cut antenna structure in accordance with an aspect of the present invention.

FIG. 10 illustrates a top view of a cross-cut antenna structure 230 in accordance with an aspect of the present invention. The cross-cut antenna structure 230 is formed from a reinforced metal foil laminate. The cross-cut antenna structure 230 provides for direct RFID chip placement without the need for contact extension. The cross-cut antenna structure 230 includes a generally T-shaped opening 232 that forms antenna contact ends 234 and 236 spaced apart via a gap 235. The T-shaped opening 232 is formed from a die cut that employs a die having a generally T-shape with a generally X-shaped gap portion.

Figure 11:
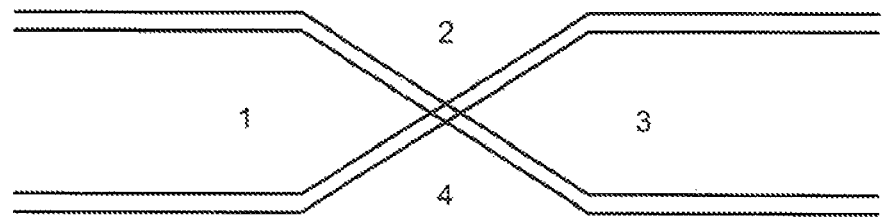
FIG. 11 illustrates a die cross-cut gap portion in accordance with an aspect of the present invention.

FIG. 11 illustrates a die cross-cut gap portion 250. The generally X-shaped gap portion of the die separates the reinforced metal foil laminate into four distinct quadrants 1, 2, 3, and 4. The undesired matrix portion of the reinforced metal foil laminate can be removed in quadrants 2 and 4 leaving the reinforced metal foil laminate in quadrant 1 and 3 with opposing generally pointed contact end tips separated by the width (e.g., about 6 microns to about 8 microns) of the die cut. The die can be selected to provide a desired width between the tips of opposing contact ends 234 and 236.

Figure 12:
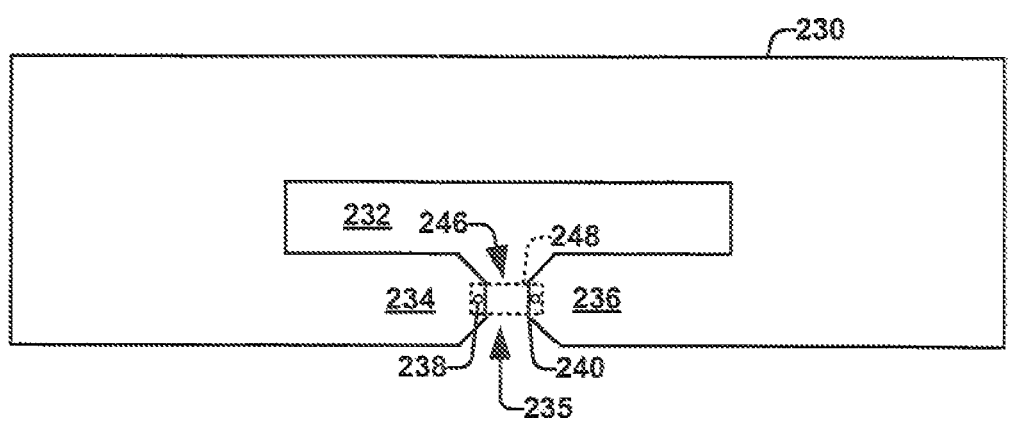
FIG. 12 illustrates a top view of the cross-cut antenna structure of FIG. 10 after a through hole is registered within the gap of the antenna structure in accordance with an aspect of the present invention.

Referring again to FIG. 10, bond pads 238 and 240 can be provided on contact ends 234 and 236, respectively. The bond pads 238 and 240 can be formed from an electrolytic process to form copper contact bond pads. AN RFID chip 242 as illustrated with dashed lines can be placed directly across the tips of the opposing contact ends 234 and 236. However, the metal foil under the RFID chip can lead to problems associated with electrical interaction with the chip functions, for example due to capacitance associated with the metal foil. Therefore, an RFID chip 244 can be rotated as illustrated with dashed lines and placed across the tips of the opposing contact ends 234 and 236 at an offset to mitigate the amount of metal foil under the RFID chip 244. Furthermore, another methodology to mitigate the amount of metal foil under the chip is to register a through hole 246 within the gap 235 as illustrated in FIG. 12. The through hole 246 can be formed by punching through and removing a predetermined amount of materials of the tips of opposing contact ends 234 and 236 to define a predetermined width across the gap 235. An RFID chip 248 as illustrated with dashed lines can be directly placed across the opposing contact ends 234 and 236.

Figure 13:
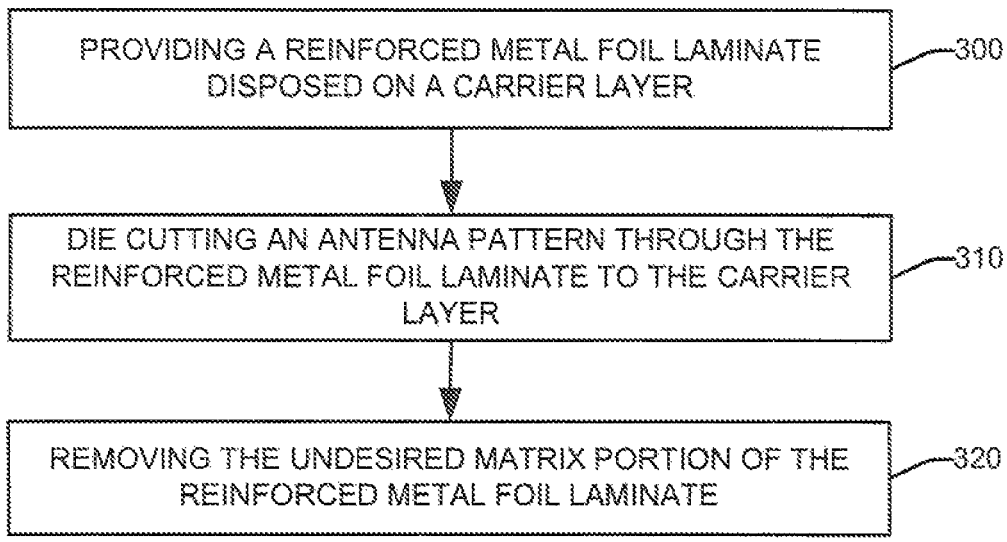
FIG. 13 illustrates methodology of forming an antenna containing element in accordance with an aspect of the present invention.
Figure 14:
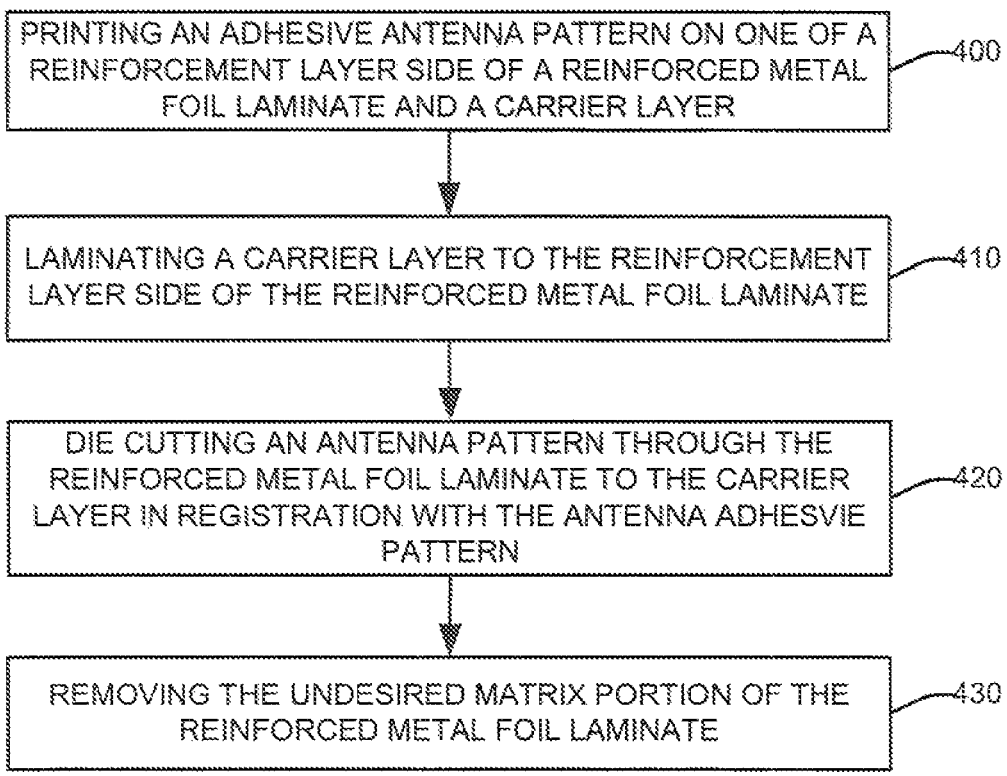
FIG. 14 illustrates another methodology of forming an antenna containing element in accordance with an aspect of the present invention.

In view of the foregoing structural and functional features described above, methodologies will be better appreciated with reference to FIGS. 13-14. It is to be understood and appreciated that the illustrated actions, in other embodiments, may occur in different orders and/or concurrently with other actions. Moreover, not all illustrated features may be required to implement a method.

FIG. 13 illustrates a methodology of forming an antenna containing element in accordance with an aspect of the present invention. The methodology begins at 300 where a reinforced metal foil laminate disposed on a carrier layer is provided. The reinforced metal foil laminate can be formed from a metal foil layer bonded to a reinforcement layer via an adhesive layer. The reinforced metal foil laminate can be bonded to the carrier via an adhesive layer. At 310, an antenna pattern is die cut through the reinforced metal foil laminate to the carrier layer. At 320, the undesired matrix portion of the reinforced metal foil laminate is removed, such that an antenna structure in the shape of the antenna pattern remains on the carrier layer.

FIG. 14 illustrates another methodology of forming an antenna containing element in accordance with an aspect of the present invention. The methodology begins at 400 where an adhesive antenna pattern is printed on one of a reinforcement layer side of a reinforced metal foil laminate and a carrier layer. The reinforced metal foil laminate can be formed from a metal foil layer bonded to a reinforcement layer via an adhesive layer. At 410, the carrier layer is laminated to the reinforcement layer side of a reinforced metal foil laminate. At 420, an antenna pattern is die cut through the reinforced metal foil laminate to the carrier layer in registration with the adhesive antenna pattern. At 430, the undesired matrix portion of the reinforced metal foil laminate is removed, such that an antenna structure in the shape of the antenna pattern remains on the carrier layer.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A web of antenna containing elements comprising:
   a metal foil layer that bonds to a carrier layer to form a metal foil laminate;
   an adhesive pattern beneath the metal foil layer and attaching the metal foil layer to the carrier layer, the adhesive pattern in a shape of an antenna pattern,
   wherein the antenna pattern is cut in the metal foil layer and adhesive pattern but not through the carrier layer and the antenna pattern is in registry with the adhesive pattern; the antenna pattern in the metal foil layer having an opening creating a gap to define antenna contact ends such that each contact end has at least one contact extension that extends from the antenna contact end into the gap, the gap being sized to allow placement of an RFID chip, and where the at least one contact extension comprises one or more layers of conductive ink built up from the carrier layer to each contact end; and
   wherein the antenna pattern is formed in the metal foil layer by a laser die cutter or a mechanical die cutter and the web is manufactured as a continuous web which is wound into roll form for use in a roll to roll process.

2. The web of antenna containing elements as recited in claim 1, wherein a thickness of the adhesive pattern ranges from about 5 to about 25 microns.

3. The web of antenna containing elements as recited in claim 1, wherein the metal foil layer has a thickness ranging from about 1.5 microns to about 20 microns.

4. The web of antenna containing elements as recited in claim 1, wherein the metal foil layer is formed from one of aluminum foil, copper foil and steel foil, and the metal foil layer has a thickness in the range of about 1.5 microns to about 20 microns.

5. The web of antenna containing elements as recited in claim 1, wherein the adhesive is one of a pressure-sensitive adhesive or an ultra violet (UV) cured adhesive.

6. The web of antenna containing elements as recited in claim 1, wherein the antenna pattern has an opening that is generally T-shaped and further has a generally X-shaped gap portion.

7. The web of antenna containing elements as recited in claim 1, wherein the metal foil laminate is releasably attached to the carrier.

8. The web of antenna containing elements as recited in 1, wherein the opening in the antenna pattern is a T-shaped opening.

9. The web of antenna containing elements as recited in claim 8, wherein the T-shaped opening has a gap sized and configured to receive an integrated circuit.

10. The web of antenna containing elements as recited in claim 9, wherein the T-shaped opening has metal contact ends with at least some portion cleared of a metal oxide layer.

11. The web of antenna containing elements as recited in claim 9, wherein each of the at least one contact extension extends between each of the antenna contact ends into the T-shaped opening allowing for direct chip placement.

12. The web of antenna containing elements as recited in claim 11, wherein the at least one contact extension further comprises at least one layer of conductive adhesive.

13. A web of antenna containing elements comprising:
    a copper or aluminum metal foil layer bonded to a UV-transparent carrier layer to form a metal foil laminate;
    a UV curable adhesive pattern beneath the metal foil layer and attaching the metal foil layer to the carrier layer, the adhesive pattern cured in the shape of an antenna pattern through the UV transparent carrier layer;
    a cross-cut antenna structure formed in the metal foil layer and adhesive pattern but not the carrier layer, the cross-cut antenna structure in the metal foil layer registry with the adhesive pattern and the cross-cut antenna having an opening creating a generally gap in the metal foil layer to define antenna contact ends such that each contact end has at least one contact extension that extends from the antenna contact end into the gap and the at least one contact extension that extends between the antenna contact ends into the T-shaped opening allowing, such that the at least one contact extension of each contact end comprises one or more layers of conductive ink built up from the carrier layer to each contact end and includes bonding pads and the gap is sized to allow placement of an RFID chip; and
    wherein the cross-cut antenna structure is formed in the metal foil layer by a mechanical die cutter or a laser cutter.

14. The web of antenna containing elements of claim 13, wherein the carrier layer transmits ultra violet (UV) light.

* * * * *